United States Patent
Keller et al.

(10) Patent No.: US 7,124,380 B2
(45) Date of Patent: Oct. 17, 2006

(54) SYSTEM AND METHOD FOR CONTROLLING ANALYSIS OF MULTIPLE INSTANTIATIONS OF CIRCUITS IN HIERARCHICAL VLSI CIRCUIT DESIGNS

(75) Inventors: S. Brandon Keller, Evans, CO (US); Gregory Dennis Rogers, Ft. Collins, CO (US); George Harold Robbert, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 322 days.

(21) Appl. No.: 10/803,561

(22) Filed: Mar. 18, 2004

(65) Prior Publication Data

US 2005/0210425 A1    Sep. 22, 2005

(51) Int. Cl.
    *G06F 17/50*    (2006.01)
(52) U.S. Cl. ............................... 716/4; 716/5
(58) Field of Classification Search ............ 716/4, 716/5
    See application file for complete search history.

(56) References Cited

U.S. PATENT DOCUMENTS

| | | | |
|---|---|---|---|
| 5,377,201 A | 12/1994 | Chakradhar et al. | |
| 5,535,370 A * | 7/1996 | Raman et al. | 703/15 |
| 5,657,240 A | 8/1997 | Chakradhar et al. | |
| 6,286,126 B1 | 9/2001 | Raghavan et al. | |
| 6,286,128 B1 * | 9/2001 | Pileggi et al. | 716/18 |
| 6,560,571 B1 | 5/2003 | McBride | |
| 6,567,967 B1 | 5/2003 | Greidinger et al. | |
| 6,643,828 B1 * | 11/2003 | Naffziger et al. | 716/2 |
| 2002/0188918 A1 * | 12/2002 | Cirit | 716/9 |
| 2003/0014201 A1 | 1/2003 | Schultz | |
| 2003/0115560 A1 * | 6/2003 | Naffziger et al. | 716/5 |
| 2003/0208730 A1 * | 11/2003 | Singhal et al. | 716/4 |
| 2004/0078767 A1 * | 4/2004 | Burks et al. | 716/8 |

* cited by examiner

Primary Examiner—Pane Dinh
Assistant Examiner—Tuyen To

(57) ABSTRACT

A method for controlling analysis by an analysis tool of multiple instantiations of a circuit in a hierarchical circuit design is described. The method comprises providing a user-selected analysis option to the analysis tool; analyzing a first instantiation of the circuit as specified by the analysis option; and responsive to the first instantiation of the circuit passing the analysis, terminating analysis of the circuit.

27 Claims, 6 Drawing Sheets

SYSTEM AND METHOD FOR CONTROLLING ANALYSIS OF MULTIPLE INSTANTIATIONS OF CIRCUITS IN HIERARCHICAL VLSI CIRCUIT DESIGNS

CROSS-REFERENCE TO RELATED APPLICATIONS

This application is related to the following commonly-owned, co-pending U.S. patent applications: U.S. patent application Ser. No. 10/803,715, filed Mar. 18, 2004 entitled "SYSTEM AND METHOD TO OPTIMIZE LOGICAL CONFIGURATION RELATIONSHIPS IN VLSI CIRCUIT ANALYSIS TOOLS"; U.S. patent application Ser. No. 10/803,692, filed Mar. 18, 2004 entitled "SYSTEM AND METHOD FOR FACILITATING EFFICIENT APPLICATION OF LOGICAL CONFIGURATION INFORMATION IN VLSI CIRCUIT ANALYSIS TOOLS"; U.S. patent application Ser. No. 10/803,610, filed Mar. 18, 2004 entitled "SYSTEM AND METHOD TO PRIORITIZE AND SELECTIVELY APPLY CONFIGURATION INFORMATION FOR VLSI CIRCUIT ANALYSIS TOOLS"; U.S. patent application Ser. No. 10/803,693, filed Mar. 18, 2004 entitled "SYSTEM AND METHOD FOR FLATTENING HIERARCHICAL DESIGNS IN VLSI CIRCUIT ANALYSIS TOOLS"; and U.S. patent application Ser. No. 10/803, 714, filed Mar 18, 2004 entitled "SYSTEM AND METHOD TO LIMIT RUNTIME OF VLSI CIRCUIT ANALYSIS TOOLS FOR COMPLEX ELECTRONIC CIRCUITS"; all of which are hereby incorporated by reference in their entirety.

BACKGROUND

In the field of integrated circuit ("IC") design and particularly very large scale integration ("VLSI") design, it is desirable to test the design before implementation and to identify potential violations in the design. Before implementation on a chip, the information about a design, including information about specific signals and devices that comprise the design, as well as information about connections between the devices, are typically stored in a computer memory. Based on the connection and device information, the designer can perform tests on the design to identify potential problems. For example, one portion of the design that might be tested is the conducting material on the chip. In particular, representations of individual metal segments may be analyzed to determine whether they meet certain specifications, such as electromigration and self-heating specifications. Other tests that may be conducted include electrical rules checking tests, such as tests for noise immunity and maximum driven capacitance, and power analysis tests that estimate power driven by a particular signal and identify those over a given current draw. These tests may be performed using software tools referred to as VLSI circuit analysis tools.

Modern semiconductor IC chips include a dense array of narrow, thin-film metallic conductors, referred to as "interconnects", that transport current between various devices on the IC chip. As the complexity of ICs continues to increase, the individual components must become increasingly reliable if the reliability of the overall IC is to be maintained. Due to continuing miniaturization of VLSI circuits, thin-film metallic conductors are subject to increasingly high current densities. Under such conditions, electromigration can lead to the electrical failure of interconnects in a relatively short period of time, thus reducing the lifetime of the IC to an unacceptable level. It is therefore of great technological importance to understand and control electromigration failure in thin film interconnects.

Electromigration can be defined as migration of atoms in a metal interconnect line due to momentum transfer from conduction electrons. The metal atoms migrate in the direction of current flow and can lead to failure of the metal line. Electromigration is dependent on the type of metal used and correlates to the melting temperature of the metal. In general, a higher melting temperature corresponds to higher electromigration resistance. Electromigration can occur due to diffusion in the bulk of the material, at the grain boundaries, or on the surface. For example, electromigration in aluminum occurs primarily at the grain boundary due to the higher grain boundary diffusivity over the bulk diffusivity and the excellent surface passivation effect of aluminum oxide that forms on the surface of aluminum when it is exposed to oxygen. In contrast, copper exhibits little electromigration in the bulk and at the grain boundary and instead primarily exhibits electromigration on the surface due to poor copper oxide passivation properties.

Electromigration can cause various types of failures in narrow interconnects, including void failures along the length of a line and diffusive displacements at the terminals of a line that destroy electrical contact. Both types of failure are affected by the microstructure of the line and can therefore be delayed or overcome by metallurgical changes that alter the microstructure. As previously noted, electromigration is the result of the transfer of momentum from electrons moving in an applied electric field to the ions comprising the lattice of the interconnect material. Specifically, when electrons are conducted through a metal, they interact with imperfections in the lattice and scatter. Thermal energy produces scattering by causing atoms to vibrate; the higher the temperature, the more out of place the atom is, the greater the scattering, and the greater the resistivity. Electromigration does not occur in semiconductors, but may in some semiconductor materials that are so heavily doped as to exhibit metallic conduction.

The driving forces behind electromigration are "direct force", which is defined as the direct action of the external field on the charge of the migrating ion, and "wind force", which is defined as the scattering of the conduction electrons by the metal atom under consideration. For simplicity, "electron wind force" often refers to the net effect of these two electrical forces. This simplification will also be used throughout the following discussion. These forces and the relation therebetween are illustrated in FIG. 1.

The electromigration failure process is predominantly influenced by the metallurgical-statistical properties of the interconnect, the thermal accelerating process, and the healing effects. The metallurgical-statistical properties of a conductor film refer to the microstructure parameters of the conductor material, including grain size distribution, the distribution of grain boundary misorientation angles, and the inclinations of grain boundaries with respect to electron flow. The variation of these microstructural parameters over a film causes a non-uniform distribution of atomic flow rate. Non-zero atomic flux divergence exists at the places where the number of atoms flowing into the area is not equal to the number of atoms flowing out of that area per unit time such that there exists either a mass depletion (divergence>0) or accumulation (divergence<0), leading to formation of voids and hillocks, respectively. In such situations, failure results either from voids growing over the entire line width, causing line breakage, or from extrusions that cause short circuits to neighboring lines.

The thermal accelerating process is the acceleration process of electromigration damage due to a local increase in temperature. A uniform temperature distribution along an interconnect is possible only absent electromigration damage. Once a void is initiated, it causes the current density to increase in the area around the void due to the reduction in the cross-sectional area of the conductor. The increase of the local current density is referred as "current crowding." Since joule heating, or "self-heating", is proportional to the square of current density, the current crowding effect leads to a local temperature rise around the void that in turn further accelerates the void growth. The whole process continues until the void is large enough to result in a line break.

Healing effects are the result of atomic flow in the direction opposite to the electron wind force, i.e., the "back-flow," during or after electromigration. The back-flow of mass is initiated once a redistribution of mass has begun to form. Healing effects tend to reduce the failure rate during electromigration and partially heals the damage after current is removed. Nonhomogenities, such as temperature and/or concentration gradients, resulting from electromigration damage are the cause of the back-flow.

The effects of electromigration may be slow to develop; however, if an electromigration problem exists, the progress toward a fault is inexorable. The results of an electromigration problem are illustrated in FIGS. 2 and 3. Before current is applied to a section of an IC chip that is first powered up, the metal comprising the interconnects thereof is uniformly distributed, as illustrated in FIG. 2, which illustrates a side view of an interconnect 200. However, in a section of metal that is at risk for electromigration, the mass transport of metal, which occurs in the direction of average current, represented in FIG. 3 by an arrow 301, results in metal moving from a first end 302a of the section to a second end 302b thereof. At some future time, depending on the amount of current flowing through and the thickness of the interconnect 200, electromigration will result in the formation of a void 304 at the first end 302a and a hillock 304 at the second end 302b. Eventually, as previously described, this migration of metal from one end of the wire to the other will result in a failure of the interconnect 200.

As also previously noted, self-heating contributes to the electromigration and actually affects the surrounding wires as well. As a wire carries current, it will heat up, thereby lowering the limits for electromigration in surrounding wires as well as the wire under consideration. It is important, therefore, to consider the effects of both electromigration and self-heating (collectively "EM/SH") when analyzing and verifying the reliability of an IC chip design.

Typically, circuit designs are provided in a hierarchical organization that allows designers to leverage common blocks in multiple areas of the design. On the other hand, conventional circuit analysis tools (including, e.g., the EM/SH analysis tools) operate on all instantiations of circuits in a hierarchical design independently, even where multiple instantiations of a particular block are encountered. It would therefore be advantageous to increase runtime efficiency of an analysis tool by addressing this drawback.

SUMMARY

One embodiment is a method for controlling analysis by an analysis tool of multiple instantiations of a circuit in a hierarchical circuit design. The method comprises providing a user-selected analysis option to the analysis tool; analyzing a first instantiation of the circuit as specified by the analysis option; and responsive to the first instantiation of the circuit passing the analysis, terminating analysis of the circuit.

DETAILED DESCRIPTION OF THE DRAWINGS

Figure 1:
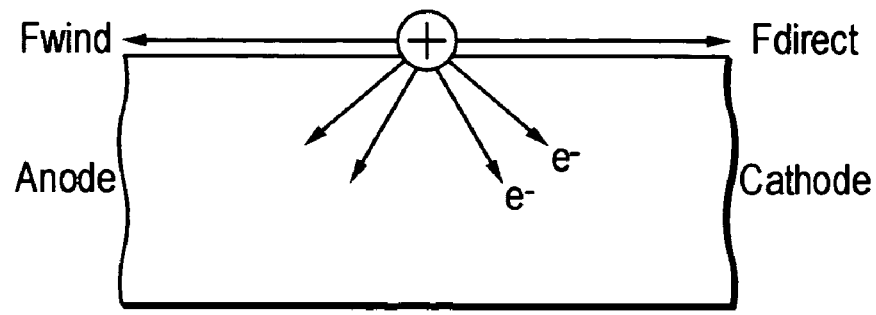
FIG. 1 illustrates the driving forces behind electromigration, including direct force and wind force.
Figure 2:
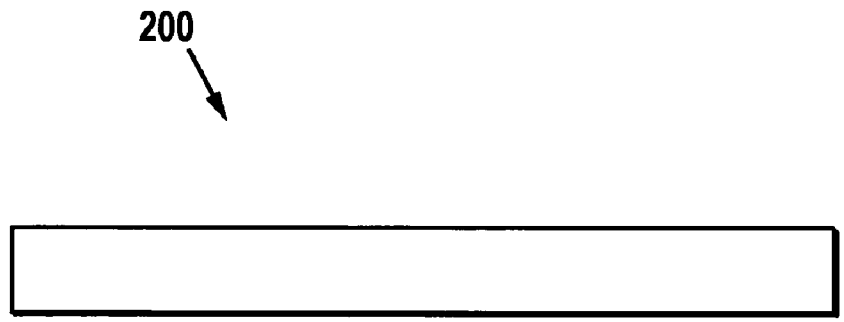
FIGS. 2 and 3 illustrate the effects of electromigration on an IC chip interconnect.
Figure 3:
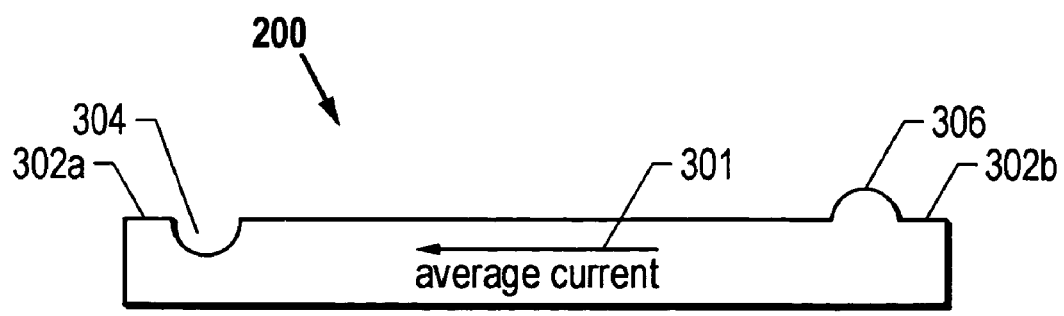

In the drawings, like or similar elements are designated with identical reference numerals throughout the several views thereof, and the various elements depicted are not necessarily drawn to scale.

Figure 4:
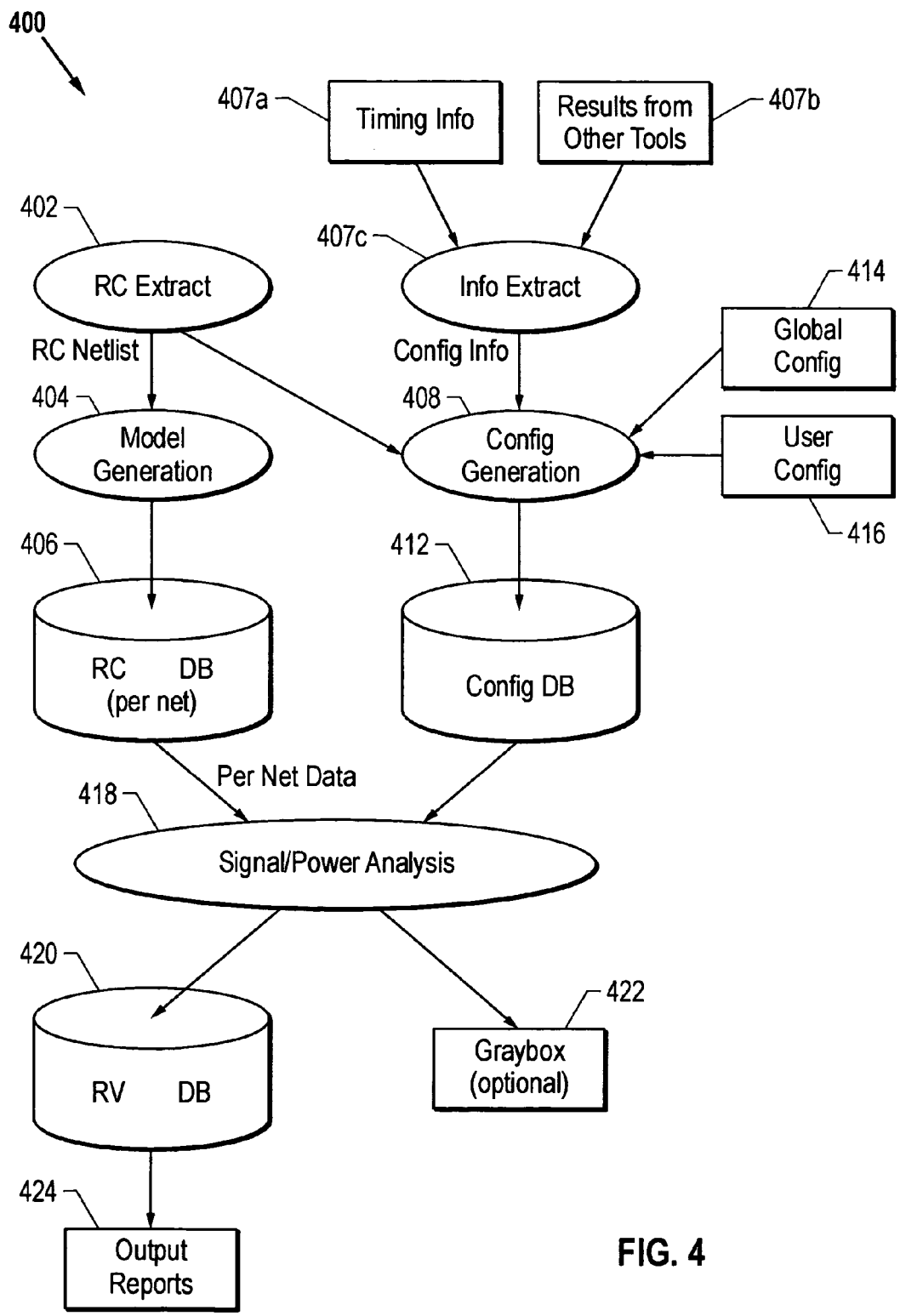
FIG. 4 is a flow diagram of a reliability verification tool ("RVT") in one embodiment.

FIG. 4 is a flow diagram of one embodiment of a VLSI circuit analysis tool, specifically, a reliability verification tool ("RVT") 400. In the illustrated embodiment, the RVT 400 is designed to find areas of an IC block layout that may have electromigration and/or self-heating ("EM/SH") risks. The output files produced by the RVT 400 are useful for viewing violations in a text manner and a violations shapes representation can be loaded on top of the block artwork to provide a visual representation of the problem areas and the changes proposed by the RVT 400 to correct those problems.

Specifically, the RVT 400 is designed to assist designers with the challenging task of identifying potential EM/SH problem areas in their designs. Since the rules of electromigration are not always intuitive and problem areas can be hard to spot, the RVT 400 is an important tool for determining if the design has any violations that, if not discovered and corrected, could lead to future chip failure. This is due to the fact that faults that electromigration can produce develop slowly over time until the metal finally breaks.

In one embodiment, the RVT 400 provides a designer with a clear, easy-to-follow approach to identifying EM/SH violations. Theoretically, design rules should prevent most wires from risk of electromigration, but cases still exist in which there may be a problem. By running the RVT 400 on a design block, a designer can ensure that the wires in the block will be reliable in the long term and will not cause a chip failure. The RVT 400 accomplishes this by calculating the currents through each piece of metal and each contact array on the chip. It compares these currents with certain process rules describing the maximum current that a given width of metal or set of contacts may carry. Any currents that do not meet the limits are reported as violations.

In order to "calculate the currents", as indicated above, the RVT 400 may be run in either "signal" or "power" mode to analyze metal connecting signals or to analyze the power grid. These two runs are performed separately to give better capacity and performance. In signal analysis, the RVT 400 first separates the chip into individual stages. A stage is a set of resistors that connect one or more driver FETs (i.e., those FETs that are connected to a supply) to the gates of one or more receiver FETs. These connections may pass through the channels of any number of pass FETs in the process. The RVT 400 takes each of these stages and attempts to simulate the likely combinations of on and off FETs, as dictated by logic configuration, taking the worst case currents determined over all of the simulations. The currents are then checked against the EM/SH rules.

In power analysis, the RVT 400 treats each power grid rail as its own stage. It uses the current through FETs connected to the rail determined in a previous signal analysis run to load the power grid. After simulating the grid with the load currents, it checks the currents calculated through each resistor against the EM/SH rules.

FIG. 4 illustrates the overall flow of data and control through the RVT 400. The diagram illustrated in FIG. 4 illustrates the flow that applies to both signal and power analysis. The RVT 400 relies on a special RC extract 402 to perform its analysis. In one embodiment, the RC extract 402 provides highly detailed resistance values to enable the EM/SH rules to be applied correctly.

A Model Generation module 400 processes the extracted RC information from the RC extract 402 into an RC database ("DB") 406 for each block. This allows easy access of the information on a per-net basis so that only the nets for a particular stage, as opposed to the entire model, need to be loaded into memory. The RC DB 406 is reused from run to run of the RVT 400 and is only regenerated when a new extract is performed.

The RVT 400 also relies on configuration information, such as timing information 407*a* and results from other analysis tools 407*b*, extracted from other sources by an info extract module 407*c*. These sources produce configuration files that, once extracted, are read in by a configuration generation phase 408 of the RVT 400. As previously noted, the extracted configuration information input to the configuration generation phase 408 may include information extracted from circuit annotation, timing information and additional circuit properties from transistor-level static timing analysis tool runs, information extracted from circuit recognition, and node activity factor ("AF") information.

In one embodiment, as indicated above, the RVT 400 has the ability to read some configuration information pertaining to logical relationships within the design, such as those logic configuration commands listed below. These commands may be specified via configuration files or via annotations directly associated with schematic representations of the design. Each of the block properties' values is a list of signal names, each of which may be prefixed by "!", indicating the opposite logic sense should be applied to that signal. The block properties include:

| | |
|---|---|
| set_high | instructs the analysis tool to set the specified net(s) to logic 1 |
| set_low | instructs the analysis tool to set the specified net(s) to logic 0 |
| unset | instructs the analysis tool to that any previous set_high or set_low information should be removed from the specified net(s) |
| merge_nodes | instructs the analysis tool to treat all of the specified nets as having the same logical value |
| mutex | instructs the analysis tool that exactly one of the specified nets should have a value of 1 |
| imutex | instructs the analysis tool that no more than one of the specified nets should have a value of 1 |
| ifthen | instructs the analysis tool as to the logical relationship of nets based on the state of the first net |
| forbid | forbids the specified combination of nets |

In one embodiment, as also indicated above, the RVT 400 has two methods for determining the activity factor on nodes. Both of these may be overridden by user configuration information if desired. The first such method is to use the default activity factors according to the node's type as determined by circuit recognition and a transistor-level static timing analysis tool. The second is to read explicit activity factors for each node. This can either specify a user-created file for activity factors or it may run some other tool to generate activity factors. If this method is selected, any node that does not have an activity factor explicitly specified therefore will default to one based on node type.

Similar to the Model Generation module 404, the Configuration Generation module 408 consolidates all of the configuration information at the beginning of a run and places this in a Config DB 412 for easy per-net access. The Configuration Generation module 408 reads a global configuration file 414 specified by a tool administrator and a user configuration file 416 specified by a user on a per-block basis. Both of these configuration files 414, 416, may be used to override the extracted configuration if necessary.

In addition to combining all of the configuration information together in a per-net fashion, the Configuration Generation module 408 also propagates some logic configuration through a process referred to as "transitive closure", as described in related U.S. patent application Ser. No. 10/803,715, which has been incorporated by reference in its entirety.

A signal/power analysis module 418 performs the main work of the RVT 400. It handles one stage at a time, calculating the currents through each resistor and applying the EM/SH rules. It generates both a Reliability Verification database ("RV DB") 420, which contains all of the information it calculates, and an optional "graybox" description 422 for the file. The RV DB 420 is subsequently processed to generate the various output reports that users actually read. In order to improve performance, the analysis may be run on serval machines in parallel. As each stage is independent, requiring only the information on the nets it contains, the analysis is easily parallelizable.

It should be noted that when the RVT 400 generates a graybox 422 for a given block, it will create both a netlist, or "BDL", file and also a config file containing all configuration information for the ports of the graybox. This allows various configuration (such as node types or activity factors) to be propagated up from a graybox. The graybox information is read in by the Model Generation module 400 and the Configuration Generation module 410 when the graybox 422 is used in the analysis of a parent block.

The RVT 400 generates a variety of output reports 424 such as a text file containing a list of all resistors that failed the EM/SH rules, along with any stages that were discarded. The RVT 400 also generates layout shapes that highlight the violations at each level of the hierarchy. The violations shapes are all stored as blocks along with the rest of the output files 424.

Running a power analysis using the RVT 400 relies on the user to have previously run a signal analysis with the RVT at or above the level on which a power analysis is to be run. During the RVT signal analysis, the default is to write out the average case and worst case current through all driver FETs (i.e. any FETs with a source or drain of VDD or GND)

to a "signal_rvdb" file so that power analysis can use those currents. This also includes writing currents through output drivers, which means that these stages are analyzed for currents, but no EM/SH checks are done on those stages and no resistor currents are reported for them.

The average and worst case currents are calculated in the signal run as follows. The worst case current is simply the worst case current through each driver FET seen during the signal run using the same activity factors ("AF") and drive fights ("DF") signal run. This current will be used in the worst case RVT power analysis, which is performed on the low level metal and via layers as specified in the global configuration file 414.

Calculating the average case current is a bit more complicated. The average case current is used to check EM/SH on the upper level metal and via layers as specified in the global configuration file 414, thus it is very important to get the current for the entire stage correct and not as important to get the current for each driver FET correct. Thus, for the average case power analysis, it is not advisable to use the worst case current. The global configuration file 414 may also specify different default activity factors for different node types to use with power analysis. For example, changing the default activity factor for static nodes to 0.2 instead of using the 0.5 used for worst case signal analysis, more accurately represents the power drawn.

During an RVT power analysis run, the RVT 400 collects the driver FET currents calculated during the RVT signal run, as described above, generates a power SPICE deck, simulates that deck, checks each resistor in the simulated grid against EM/SH rules, and generates output files, including violations files, and power grayboxes if requested to do so.

VLSI design relies heavily on hierarchical description, primarily because large amounts of design detail can be concealed within a such a description. In view of the complexity of most circuits, a complete design is often represented as a collection of component aggregates further divided into subaggregates in a hierarchical and recursive manner. These aggregates are typically referred to as "cells" or "blocks". The use of a block at a hierarchical level is referred to as an "instance". Graphically, each instance of a block in a higher hierarchical level can be represented as a footprint designated the location of the instance. The footprint may or may not show the block's contents.

The term "leaf block" refers to a block that is at the bottom of the hierarchy; that is, a block that does not contain any instances of any other blocks. The term "root block" refers to the one block that is at the top of the hierarchy and therefore is not contained as an instance in any other block. The term "composition block" is used to refer to each of the remaining blocks, which comprise the body of the hierarchy. Hierarchy is conventionally discussed in terms of depth, with the leaf blocks comprising the deepest, or lowest, layer and the root block comprising the highest layer. A design with no hierarchy is said to be flat. Certain types of CAD tools require that a design be flat because they are unable to handle hierarchical descriptions. A circuit that has all of its block instances recursively replaced with their respective contents is said to have been flattened.

Figure 5A:
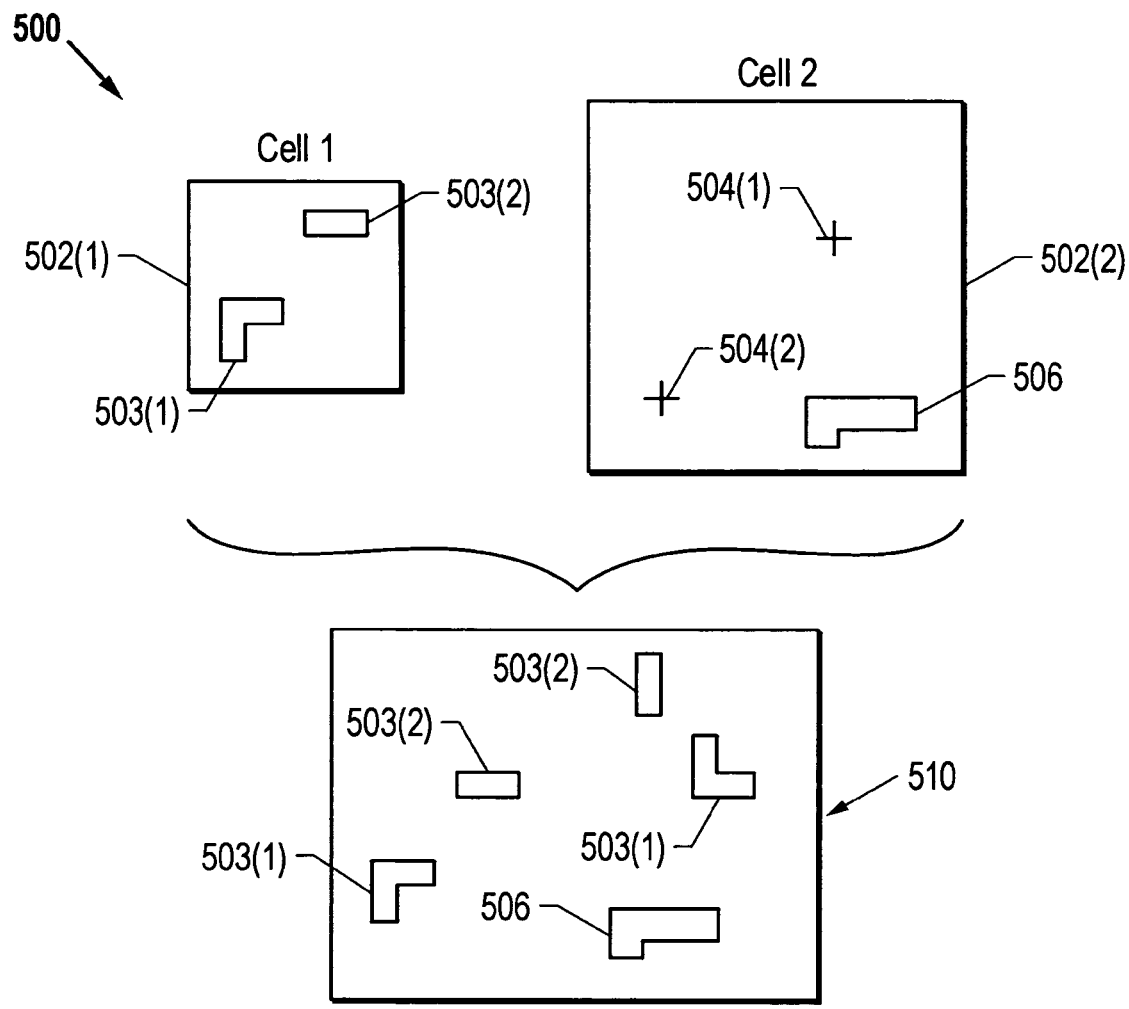
FIG. 5A is a block diagram illustrating hierarchical design of a VLSI circuit.

FIG. 5A illustrates a hierarchical design of a VLSI circuit, designated by reference numeral 500. The design 500 comprises two blocks, respectively designated by reference numerals 502(1) and 502(2). The block 502(1) includes two circuits 503(1), 503(2). The block 502(2) is a higher hierarchical level block than the block 502(1) and includes two instantiations of the block 502(1), as represented by cross-hatches ("+") designated by reference numerals 504(1) and 504(2). For purposes of example, it will be assumed that the instantiation 504(1) is rotated 90 degrees with respect to the instantiation 504(2). The block 502(2) also includes an additional circuit 506. A flattened representation of the block 502(2) is designated in FIG. 5A by a reference numeral 510.

In electronics, components are viewed in terms of how they move signals back and forth across wires. All components have locations that attach to wires that make a connection to other locations on other components. Accordingly, an implicit requirement of VLSI design is that components are connected and connections carry information about the relationship of the connected components.

A related concept is that of a "net", which is a single electrical path in a circuit that has the same value at all of its points. Any collection of wires that carries the same signal between components comprises a net. Moreover, if a component passes the signal though without altering it, such as is the case with a terminal, the net continues on subsequently connected wires. Otherwise, the net terminates a component that alters the signal and a new net begins on the other side of that component. A component that passes a signal unaltered is referred to as a passive component; a component that alters a signal that passes through is referred to as an active component.

In general, VLSI circuit analysis tools simply analyze all instantiations of circuits in a hierarchical design independently. In contrast, in accordance with the embodiments of a VLSI circuit analysis tool, such as the RVT 400, described herein, several possible options are presented in which multiple instantiations of a circuit can be verified with the analysis of only one instantiation. These options may include, for example:

1. analyze the worst-case instantiation of a circuit and if that instantiation fails, do not analyze the remaining instantiations;
2. analyze the worst-case instantiation of the circuit and if that instantiation fails, analyze all of the remaining instantiations;
3. analyze a user-specified instantiation of the circuit and if that instantiation fails, do not analyze the remaining instantiations;
4. analyze a user-specified instantiation of the circuit and if that instantiation fails, analyze all of the remaining instantiations;
5. analyze a composite worst-case instantiation of the circuit and if that instantiation fails, do not analyze the remaining instantiations; and
6. analyze a composite worst-case instantiation of the circuit and if that instantiation fails, analyze all of the remaining instantiations.

With all of the above-described options, if the selected worst-case or user-specified circuit passes the analysis, the remaining instantiations do not need to be analyzed, as it can be safely assumed that they too will pass. The analysis tool that utilizes the embodiments described herein may then handle multiple instantiations of circuits according to a user-specified analysis option selection (e.g., via a user configuration file, such as the user configuration file 416) that indicates which of the six options listed above should be used for each individual circuit of a design.

Figure 5B:
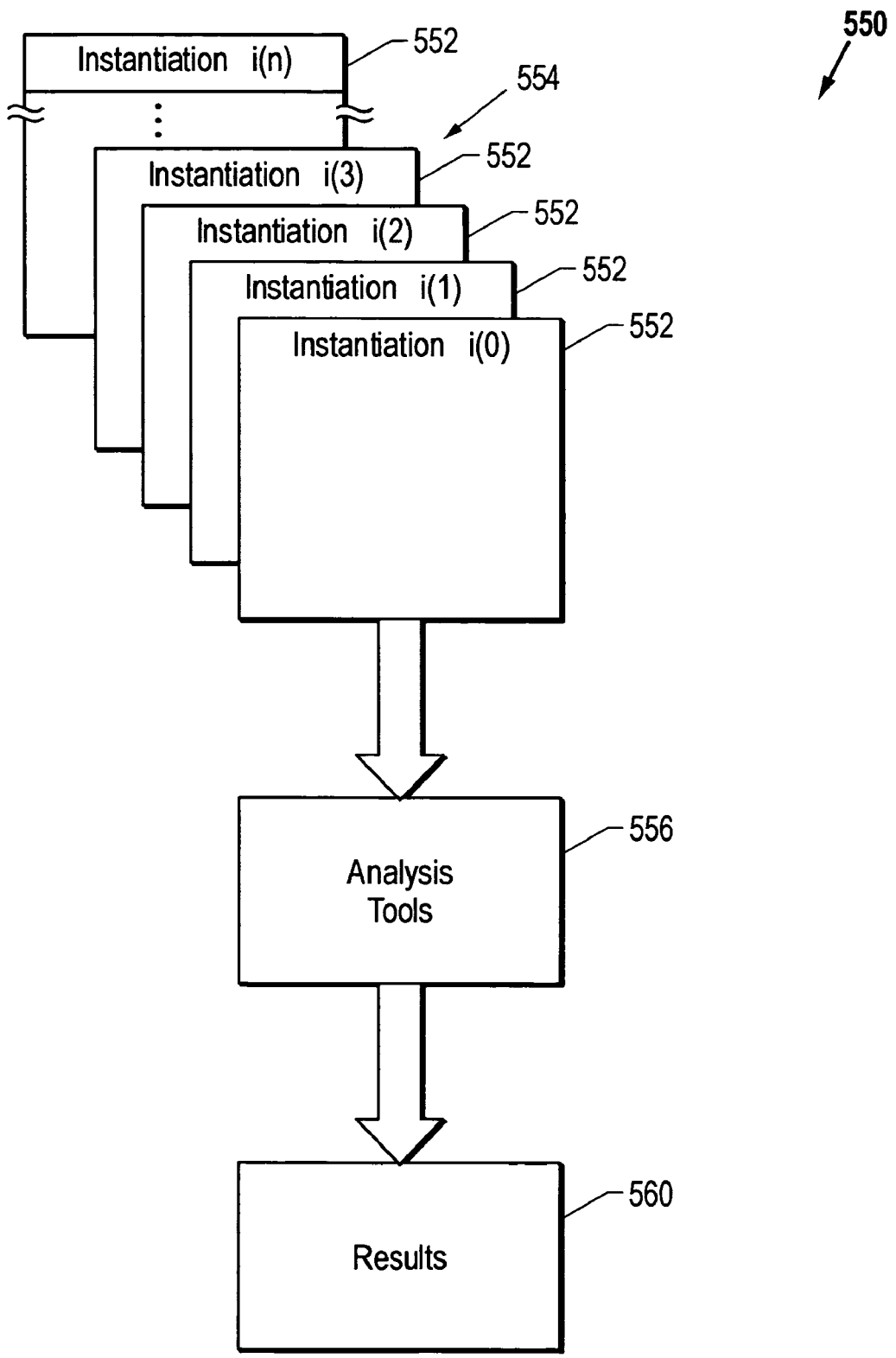
FIG. 5B is a block diagram of a system for controlling analysis of multiple instantiations of a circuit in a VLSI analysis tool according to one embodiment.

FIG. 5B is a block diagram of a system 550 for controlling analysis of multiple instantiations 552 of a circuit 554 in a VLSI analysis tool 556 according to one embodiment. As previously indicated, information identifying a user-specified analysis option 558 to be used in connection with analyzing the multiple instantiations 552 of the circuit 554 is input to the VLSI analysis tool 556 from the user configuration file 416 (FIG. 4). Once the VLSI analysis tool 556, which may be, for example, the RVT 400, analyzes the circuit 554 in accordance with the user-specified selection option 558, results 560 of the analysis are made available in a manner such as that previously described.

Figure 6A:
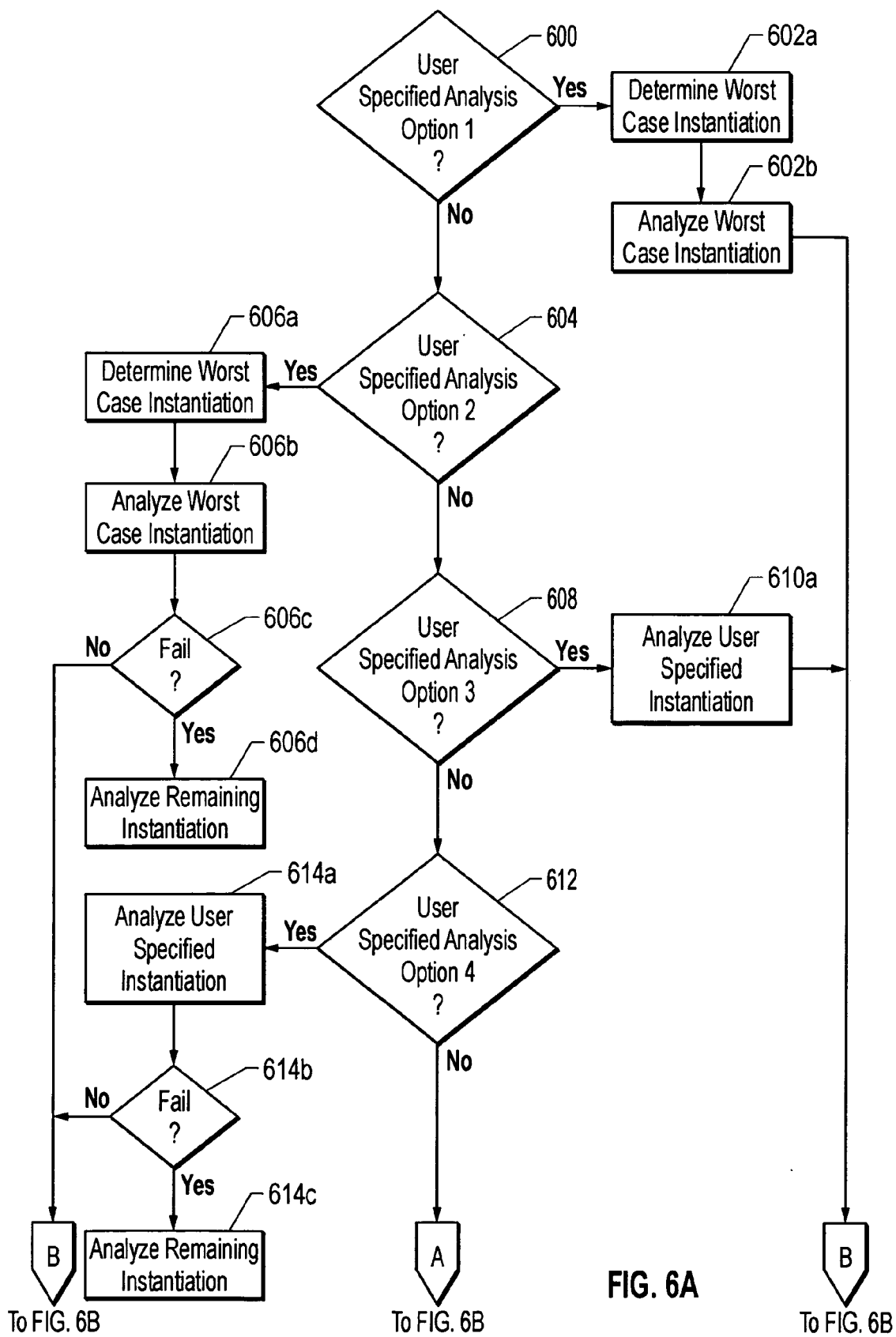
FIGS. 6A and 6B collectively illustrate a flowchart of the operation of the system of FIG. 5B according to one embodiment.
Figure 6B:
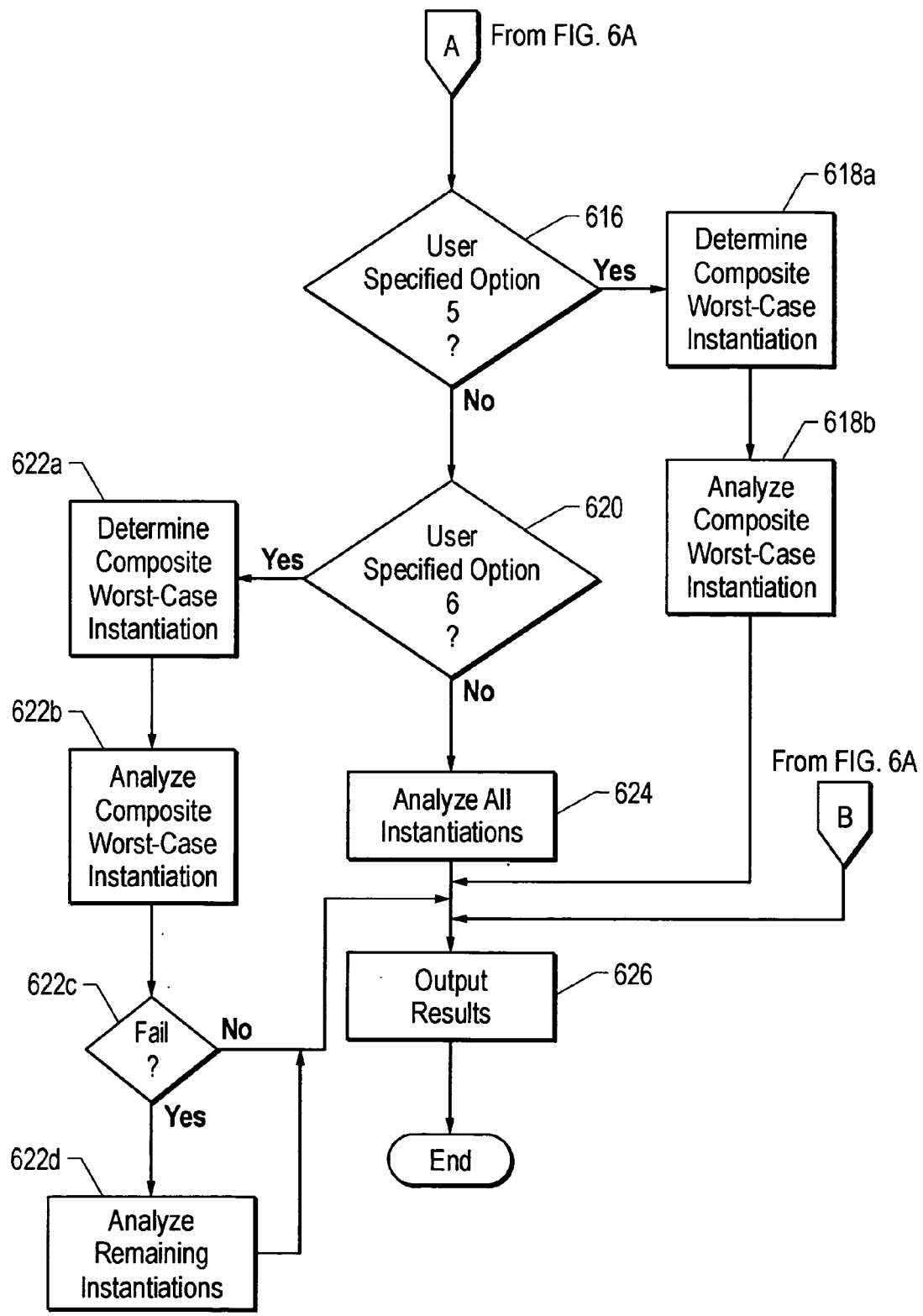

FIGS. 6A and 6B collectively illustrate a flowchart of the operation of one embodiment for controlling the analysis of multiple instantiations of a circuit in a VLSI analysis tool, such as the RVT 400. It will be recognized that the process illustrated in FIGS. 6A–6B will be applied to each circuit to be analyzed by the analysis tool. In step 600, a determination is made whether the user has specified that option 1 should be used in conducting the analysis of the circuit. If so, execution proceeds to step 602a, in which the worst case instantiation is selected. This is performed by considering several factors that affect the performance of the circuit, including, for example, a high AF, input/output slope combinations for any drivers that maximize the crossover current for the driven signals, logic configurations that provide the most possible switching states, high drive fight scale factors (for circuits containing a known drive fight condition), and any other factors that increase loading on the signals in the circuit (e.g., wire capacitance factors). In step 602b, the worst case instantiation is analyzed.

If a negative determination is reached in step 600, execution proceeds to step 604, in which a determination is made whether the user has specified that option 2 should be used in conducting the analysis of the circuit. If so, execution proceeds to step 606a, in which the worst case instantiation is selected. In step 606b, the worst case instantiation is analyzed. In step 606c, a determination is made whether the analyzed instantiation failed. If so, execution proceeds to step 606d, in which all of the remaining instantiations are analyzed.

If a negative determination is reached in step 604, execution proceeds to step 608, in which a determination is made whether the user has specified that option 3 should be used in conducting the analysis of the circuit. If so, execution proceeds to step 610a, in which the user-specified worst case instantiation is analyzed.

If a negative determination is reached in step 608, execution proceeds to step 612, in which a determination is made whether the user has specified that option 4 should be used in conducting the analysis of the circuit. If so, execution proceeds to step 614a, in which the user-specified worst case instantiation is analyzed. In step 614b, a determination is made whether the instantiation has failed. If so, execution proceeds to step 614c, in which all of the remaining instantiations are analyzed.

If a negative determination is reached in step 612, execution proceeds to step 616, in which a determination is made whether the user has specified that option 5 should be used in conducting the analysis of the circuit. If so, execution proceeds to step 618a, in which a composite worst case instantiation is determined. This is accomplished as described in greater detail below. In step 618b, the composite worst case instantiation is analyzed.

If a negative determination is reached in step 616, execution proceeds to step 620, in which a determination is made whether the user has specified that option 6 should be used in conducting the analysis of the circuit. If so, execution proceeds to step 622a, in which case a composite worst case instantiation is determined. In step 622b, the composite worst case instantiation is analyzed. In step 622c, a determination is made whether the instantiation failed the analysis. If so, execution proceeds to step 622d, in which the remaining instantiations are analyzed.

If a negative determination is reached in step 620, meaning that no user-specified analysis option has been specified, execution proceeds to step 624, in which it is determined that all of the instantiations of the circuit should be analyzed and execution proceeds accordingly. Following analysis of the circuit as indicated, either by the user-specified analysis option or lack of same, in step 626, results are provided in a manner previously described. Execution terminates in step 628.

Various configuration factors may be considered in determining a composite worst case instantiation for a circuit, as described in steps 618a and 622a. These may include selecting the input and output slope combinations for any drivers of the circuit in such a manner as to maximize the crossover current for the driven signals; selecting the maximum AFs for each net in the circuit; selecting the set of logic configuration that provides the most possible switching states for the circuit; selecting the maximum drive fight scale factor if the circuit contains a known drive fight condition; and selecting the maximum of any scale factors that increase loading on the signals in the circuit (e.g., wire capacitance factors).

Conventional VLSI circuit analysis tools simply analyze all instantiations of circuits in a hierarchical design independently. In contrast, the embodiments described herein offer several alternatives to analyzing all of the circuits by taking advantage of several possible situations where multiple instantiations of a circuit can be verified with the analysis of only one instantiation. In addition, the user is provided with the opportunity to indicate whether the analysis should proceed if the identified circuit does not pass, thereby saving the user time required to analyze all instantiations when simple configuration commands may enable the identified worst case circuit instantiation to pass, thereby eliminating the need to analyze all instantiations.

Moreover, conventional VLSI circuit analysis tools do not provide a mechanism for the identification of a composite worst case instantiation of a given circuit of a design. The embodiments described herein enables an analysis tool to operate on a worst case example of any given circuit, thereby to avoid analyzing all instantiations of the circuit if the composite worst case stage passes whatever analysis checks are performed by the tool.

An implementation of the invention described herein thus provides system and method for controlling analysis of multiple instantiations of a circuit in hierarchical VLSI circuit designs. The embodiments shown and described have been characterized as being illustrative only; it should therefore be readily understood that various changes and modifications could be made therein without departing from the scope of the present invention as set forth in the following claims.

What is claimed is:

1. A method for controlling analysis of multiple instantiations of a circuit in a hierarchical circuit design, the method comprising:
providing a user-selected analysis option to a reliability verification tool;
analyzing a first instantiation of the circuit as specified by the analysis option, the first instantiation being selected responsive to the user-selected analysis option provided via a user configuration file supplied in association with the reliability verification tool, wherein the reliability verification tool is operable to analyze electromigration effects with respect to the first instantiation of the circuit; and responsive to the first instantiation of the circuit passing the analysis, terminating analysis of the circuit.

2. The method of claim 1 further comprising providing results of the analysis.

3. The method of claim 1 further comprising, responsive to the first instantiation of the circuit failing the analysis, terminating analysis of the circuit.

4. The method of claim 3 further comprising providing results of the analysis.

5. The method of claim 1 further comprising, responsive to the first instantiation of the circuit failing the analysis, analyzing all remaining instantiations of the circuit.

6. The method of claim 5 further comprising providing results of the analysis.

7. The method of claim 1 wherein the first instantiation of the circuit comprises a composite worst case instantiation of the circuit, the method further comprising determining a composite worst case instantiation of the circuit.

8. The method of claim 7 wherein the determining the composite worst case instantiation of the circuit comprises for each net in the circuit:

selecting one of the instantiations having a highest activity factor for the net and assigning the highest activity factor to the net of the composite worst case instantiation;

selecting a logic configuration set that provides a maximum possible switching states for the circuit and assigning the logic configuration to the composite worst case instantiation; and selecting a maximum of any scale factors that increase loading on signals in the circuit and assigning the selected scale factors to the composite worst case instantiation.

9. The method of claim 7 further comprising, for each driver in the circuit, selecting an input and output slope combination for the driver that maximizes a crossover current for a signal driven by the driver and assigning the selected input and output slope combination to the driver in the composite worst case instantiation.

10. The method of claim 7 further comprising selecting a maximum drive fight scale factor and assigning the maximum drive fight scale factor to the composite worst case instantiation.

11. The method of claim 1 wherein the first instantiation of the circuit comprises a worst-case instantiation of the circuit.

12. A system for analyzing multiple instantiations of a circuit in a hierarchical circuit design, the system comprising:

means for analyzing a first instantiation of the circuit, the first instantiation being selected responsive to a user-selected analysis option provided via a user configuration file supplied in association with a reliability verification tool, wherein the reliability verification tool is operable to analyze electromigration effects with respect to the first instantiation of the circuit;

means responsive to the first instantiation of the circuit passing the analysis for terminating analysis of the circuit; and means for providing results of the analysis.

13. The system of claim 12 further comprising, means responsive to the first instantiation of the circuit failing the analysis for terminating analysis of the circuit.

14. The system of claim 12 further comprising, means responsive to the first instantiation of the circuit failing the analysis for analyzing all remaining instantiations of the circuit.

15. The system of claim 12 wherein the first instantiation of the circuit comprises a composite worst case instantiation of the circuit, the system further comprising means for determining a composite worst case instantiation of the circuit.

16. The system of claim 15 wherein the means for determining the composite worst case instantiation of the circuit comprises, for each net in the circuit:

means for selecting one of the instantiations having a highest activity factor for the net;

means for selecting a logic configuration set that provides a maximum possible switching states for the circuit;

means for selecting a maximum of any scale factors that increase loading on signals in the circuit;

means for assigning the highest activity factor to the net of the composite worst case instantiation; and means for assigning the logic configuration to the composite worst case instantiation and the selected scale factors to the composite worst case instantiation.

17. The system of claim 15 further comprising, for each driver in the circuit:

means for selecting input and output slope combination for the driver that maximize a crossover current for a signal driven by the driver; and means for assigning the selected input and output slope combination to the driver in the composite worst case instantiation.

18. The system of claim 15 further comprising:

means for selecting a maximum drive fight scale factor; and means for assigning the maximum drive fight scale factor to the composite worst case instantiation.

19. The system of claim 12 wherein the first instantiation of the circuit comprises a worst-case instantiation of the circuit.

20. A computer-readable mediun operable with a computer for controlling analysis of multiple instantiations of a VLSI circuit in a hierarchical circuit design, the medium having stored thereon:

computer-executable instructions for analyzing a first instantiation of the circuit, the first instantiation being selected responsive to a user-selected analysis option provided via a user configuration file supplied in association with a reliability verification tool, wherein the reliability verification tool is operable to analyze electromigration effects with respect to the first instantiation of the circuit;

computer-executable instructions responsive to the first instantiation of the circuit passing the analysis for terminating analysis of the circuit; and computer-executable instructions for generating results of the analysis.

21. The medium of claim 20 further having stored thereon computer-executable instructions responsive to the first instantiation of the circuit failing the analysis for terminating analysis of the circuit.

22. The medium of claim 20 further having stored thereon computer-executable instructions responsive to the first instantiation of the circuit failing the analysis for analyzing all remaining instantiations of the circuit.

23. The medium of claim 20 wherein the first instantiation of the circuit comprises a composite worst case instantiation of the circuit, the medium further having stored thereon computer-executable instructions for determining a composite worst case instantiation of the circuit.

24. The medium of claim 23 wherein the computer-executable instructions for determining the composite worst case instantiation of the circuit comprise:
   computer-executable instructions for selecting one of the instantiations having a highest activity factor for each the net of the circuit and assigning the highest activity factor to the net of the composite worst case instantiation;
   computer-executable instructions for selecting a logic configuration set that provides a maximum possible switching states for the circuit and assigning the logic configuration to the composite worst case instantiation; and
   computer-executable instructions for selecting a maximum of any scale factors that increase loading on signals in the circuit and assigning the selected scale factors to the composite worst case instantiation.

25. The medium of claim 23 further comprising, for each driver in the circuit:
   computer-executable instructions for selecting an input and output slope combination for the driver that maximizes a crossover current for a signal driven by the driver and assigning the selected input and output slope combination to the driver in the composite worst case instantiation.

26. The medium of claim 23 further comprising:
   computer-executable instructions for selecting a maximum drive fight scale factor and assigning the maximum drive fight scale factor to the composite worst case instantiation.

27. The medium of claim 20 wherein the first instantiation of the circuit comprises a worst-case instantiation of the circuit.

* * * * *